(12) United States Patent
Brouillette et al.

(10) Patent No.: US 6,888,223 B2
(45) Date of Patent: May 3, 2005

(54) USE OF PHOTORESIST IN SUBSTRATE VIAS DURING BACKSIDE GRIND

(75) Inventors: Donald W. Brouillette, St. Albans, VT (US); Joseph D. Danaher, Hinesburg, VT (US); Timothy C. Krywanczyk, Essex Junction, VT (US); Amye L. Wells, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/405,763

(22) Filed: Apr. 1, 2003

(65) Prior Publication Data

US 2004/0198021 A1 Oct. 7, 2004

(51) Int. Cl.[7] .............................................. H01L 23/048
(52) U.S. Cl. ....................... 257/621; 257/622; 438/459; 438/667
(58) Field of Search ................................ 257/774, 737, 257/758, 759, E31.12, 622, 621; 438/459

(56) References Cited

U.S. PATENT DOCUMENTS

| | | | |
|---|---|---|---|
| 3,725,215 A | 4/1973 | Uchytil | |
| 4,728,568 A | 3/1988 | Sasada et al. | |
| 4,911,796 A | 3/1990 | Reed | |
| 4,970,578 A | * 11/1990 | Tong et al. | .................. 257/774 |
| 5,037,782 A | * 8/1991 | Nakamura et al. | .......... 438/167 |
| 5,051,811 A | * 9/1991 | Williams et al. | ............. 257/779 |
| 5,198,695 A | * 3/1993 | Hanes et al. | ................. 257/773 |
| 5,277,929 A | 1/1994 | Seki et al. | |
| 5,696,002 A | * 12/1997 | Frank et al. | ................... 438/67 |
| 5,773,352 A | * 6/1998 | Hamajima | .................. 438/406 |
| 5,843,845 A | * 12/1998 | Chung | .......................... 438/713 |
| 5,854,085 A | * 12/1998 | Raab et al. | .................. 438/123 |
| 5,885,717 A | 3/1999 | Price et al. | |
| 5,915,198 A | * 6/1999 | Ko et al. | ...................... 438/592 |
| 6,097,091 A | * 8/2000 | Ohsumi | ........................ 257/758 |
| 6,110,825 A | * 8/2000 | Mastromatteo et al. | ..... 438/667 |
| 6,180,527 B1 | 1/2001 | Farnworth et al. | |
| 6,282,782 B1 | 9/2001 | Biunno et al. | |
| 6,303,469 B1 | * 10/2001 | Larson et al. | ............... 438/459 |
| 6,312,621 B1 | 11/2001 | Pedigo et al. | |
| 2002/0185661 A1 | * 12/2002 | Kawanobe et al. | ......... 257/200 |

OTHER PUBLICATIONS

Wolf and Tauber; Silicon Processing for the VLSI Era vol. 1: Process Technology; pp. 407 and 408; 1986; Lattice Press; Sunset Beach, CA.*

* cited by examiner

Primary Examiner—George Fourson
Assistant Examiner—Fernando L. Toledo
(74) Attorney, Agent, or Firm—Schmeiser, Olsen & Watts; William H. Steinberg

(57) ABSTRACT

A structure and method of formation. The substrate has front and back surfaces on opposite sides of the substrate. The substrate has a backside portion extending from the back surface to a second depth into the substrate as measured from the front surface. At least one via is formed in the substrate and extends from the front surface to a via depth into the substrate. The via depth is specific to each via. The via depth of each via is less than an initial thickness of the substrate. The second depth does not exceed the minimum via depth of the via depths. Organic material (e.g., photoresist) is inserted into each via. The organic material is subsequently covered with a tape, followed by removal of the backside portion of the substrate. The tape is subsequently removed from the organic material, followed by removal of the organic material from each via.

32 Claims, 18 Drawing Sheets

USE OF PHOTORESIST IN SUBSTRATE VIAS DURING BACKSIDE GRIND

BACKGROUND OF THE INVENTION

1. Technical Field

The present invention relates to a method and an associated electrical structure relating to use of phototoresist in substrate vias during backside grind of the substrate.

2. Related Art

Current methods for implementing backside grind of a substrate in the presence of a frontside blind via are subject to ground substrate material passing through the via from the backside of the substrate and damaging the frontside of the substrate. Thus there is a need for a method and associated electrical structure implementing backside grind of a substrate in the presence of frontside blind vias, wherein said method and structure does not result in damage to the frontside of the substrate.

SUMMARY OF THE INVENTION

The present invention provides a method for forming an electrical structure, comprising the steps of:

providing a substrate having a front surface and a back surface on opposite sides of the substrate, wherein a first depth of the substrate extends from the front surface to the back surface;

forming in the substrate at least one via extending from the front surface to a via depth into the substrate from the front surface, wherein the via depth is specific to each via of the at least one via, and wherein the via depth of each via is less than the first depth;

inserting organic material in each via to fill each via with the organic material;

covering the organic material in each via with a tape; and removing a backside portion of the substrate, wherein the backside portion extends from the back surface to a second depth into the substrate from the front surface, and wherein the second depth does not exceed the minimum via depth of the via depths.

The present invention provides an electrical structure, comprising:

a substrate having a front surface and a back surface on opposite sides of the substrate, wherein a first depth of the substrate extends from the front surface to the back surface;

at least one via in the substrate, wherein each via of the at least one via extends from the front surface to a via depth into the substrate from the front surface, wherein the via depth is specific to each via, wherein the via depth of each via is less than the first depth, wherein each via comprises an organic material disposed between a first end of the via and a second end of the via, wherein the organic material in each via decouples air pressure adjacent to the first end of the via from air pressure adjacent to the second end of the via; and a tape covering the organic material in each via.

The present invention provides an electrical structure, comprising:

a substrate having a front surface and a back surface on opposite sides of the substrate, wherein a first depth of the substrate extends from the front surface to the back surface; and at least one via in the substrate, wherein each via of the at least one via extends from the front surface to a via depth into the substrate from the front surface, wherein the via depth is specific to each via, wherein the via depth of each via is less than the first depth, wherein a first organic material on the front surface is soluble in a developer solution, wherein a second organic material on the front surface is not soluble in the developer solution, and wherein each via comprises a third organic material disposed between a first end of the via and a second end of the via.

The present invention provides a method and associated electrical structure implementing backside grind of a substrate in the presence of frontside blind vias, wherein said method and structure does not result in damage to the frontside of the substrate.

DETAILED DESCRIPTION OF THE INVENTION

Figure 1:
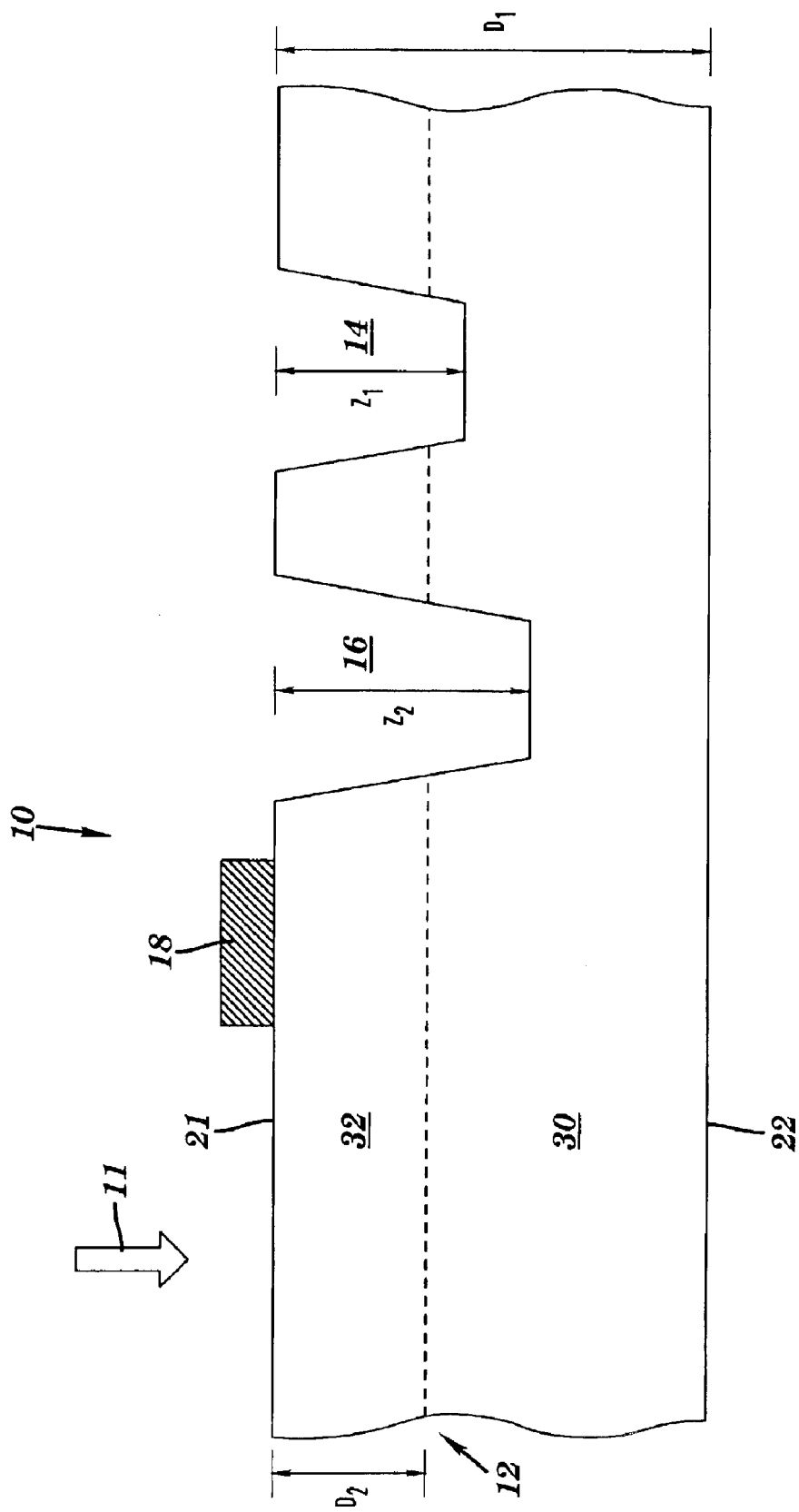
FIG. 1 depicts a front cross-sectional view of an electrical structure having vias in the frontside of a substrate, in accordance with embodiments of the present invention.

FIG. 1 depicts a front cross-sectional view of an electrical structure 10 comprising a substrate 12, and metal circuitry 18 on a front surface 21 of substrate 12, in accordance with embodiments of the present invention. The substrate 12 comprises a frontside portion 32 and a backside portion 30. Two surfaces, namely the front surface 21 and a back surface 22, bound the substrate 12 as shown. The substrate 12 has a depth $D_1$, which is an initial total depth, as measured from the front surface 21 into the substrate 12 in the direction 11. The frontside portion 32 of the substrate 12 has a depth $D_2$ as measured from the front surface 21 into the substrate 12 in the direction 11. Thus the frontside portion 32 and the backside portion 30 has a thickness of $D_2$ and $(D_1-D_2)$, respectively. The backside portion 30 will be subsequently removed as will be described infra in conjunction with FIG. 4. The substrate 12 may represent, inter alia, a wafer, a chip carrier, etc. The substrate 12 may comprise, inter alia, insulative material, dielectric material, etc.

The substrate 12 comprises a first via 14 and a second via 16. The first via 14 has a depth $Z_1$ as measured from the front surface 21 into the substrate 12 in the direction 11. The second via 16 has a depth $Z_2$ as measured from the front surface 21 into the substrate 12 in the direction 11. The depths $Z_1$ and $Z_2$ may have any numerical relationship with each other, namely $Z_1<Z_2$ (as illustrated in FIG. 1), $Z_1=Z_2$, or $Z_1>Z_2$. Additionally, the vias 14 and 16 are blind vias in FIG. 1 (but will become through vias when the backside portion 30 is subsequently removed), so that $Z_1<D_1$ and $Z_2<D_1$ must be satisfied. While FIG. 1 shows the two vias 14 and 16, the substrate 12 may comprise only one of vias 14 and 16, or may comprise any number of vias in addition to vias 14 and 16. Letting $Z_{MIN}$ denote the minimum depth of all of such vias (e.g., the minimum value of $Z_1$ and $Z_2$ in FIG. 1), the depth or thickness $D_2$ of the frontside portion 32 may be subject to the constraint of having $D_2$ not exceed $Z_{MIN}$ which has the effect that removal of the backside portion 30 exposes backsides of each of said vias. Thus both $D_2=Z_{MIN}$ and $D_2=Z_{MIN}$ are within the scope of the present invention.

Figure 2:
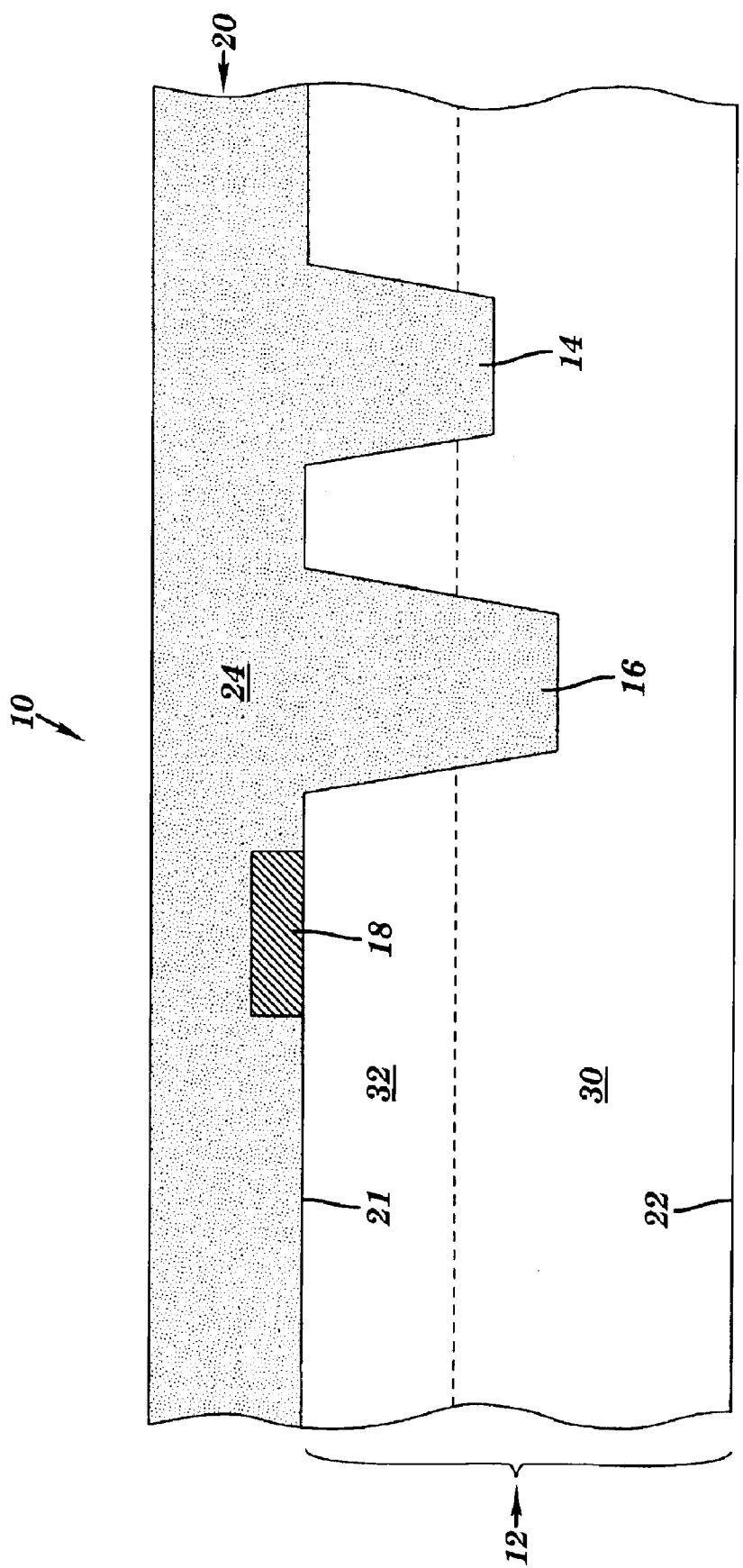
FIG. 2 depicts FIG. 1 after a photoresist layer has been placed on the frontside of the substrate such that the photoresist fills the vias, in accordance with embodiments of the present invention.

FIG. 2 depicts FIG. 1 after a photoresist layer 20 comprising photoresist 24, has been placed on the front surface 21 of the substrate 12 such that the photoresist 24 fills the vias 14 and 16, in accordance with embodiments of the present invention. The photoresist 24 is photosensitive to radiation characterized by a wavelength (e.g., an ultraviolet radiation wavelength). The photoresist 24 may comprise a positive photoresist or a negative photoresist. If unexposed to said radiation, a positive photoresist is insoluble in a developer solution, and upon exposure to said radiation the positive photoresist becomes soluble in the developer solution. If unexposed to said radiation, a negative photoresist is soluble in a developer solution, and upon exposure to said radiation the negative photoresist becomes insoluble in the developer solution. Filling the vias 14 and 16 with the photoresist 24 may be formed before, concurrent with, or after the placing photoresist 24 on the front surface 21 of the substrate 12.

A spin-on technique may be used for dispensing the photoresist 24 on the front surface 21 and inserted into the vias 14 and 16. With the spin-on technique, the photoresist 24 is directed to a central portion of the front surface 21 while the substrate 12 is spinning about an axis in the direction 11 (see FIG. 1), said axis passing through said central portion. The photoresist 24 is thrust by a centrifugal force in an outward direction from said central portion so as to cover the front surface 21 and fill the vias 14 and 16.

Figure 3:
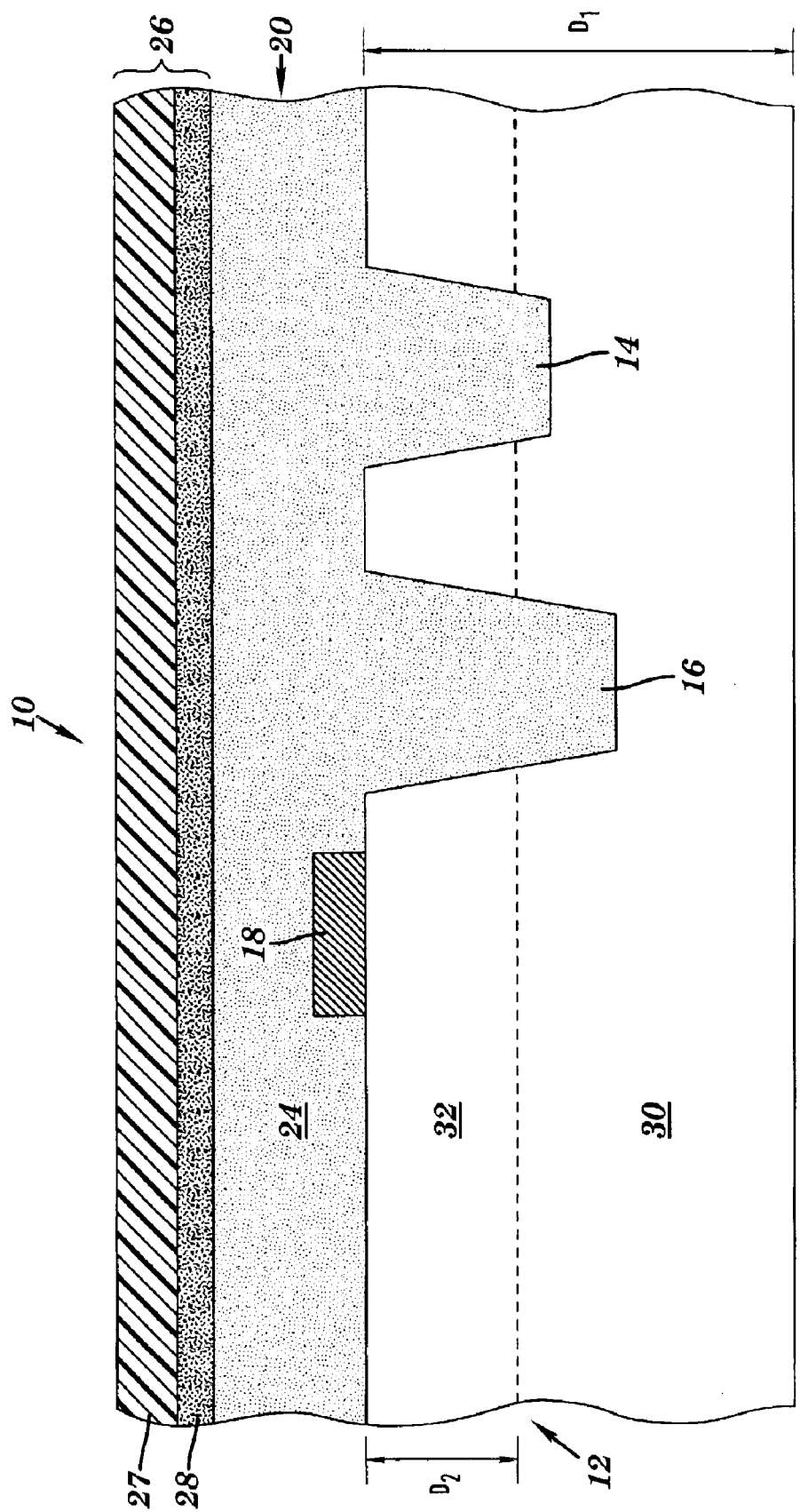
FIG. 3 depicts FIG. 2 with a tape adhesively placed on the photoresist layer, in accordance with embodiments of the present invention.

FIG. 3 depicts FIG. 2 with a tape 26 adhesively placed on the photoresist 24, in accordance with embodiments of the present invention. The tape 26 comprises a base portion 27 and an adhesive portion 28, wherein the adhesive portion 28 adhesively couples the tape 26 to the photoresist 24, and wherein the adhesive portion 28 has a greater adhesion with the base portion 27 than with the photoresist 24.

Figure 8:
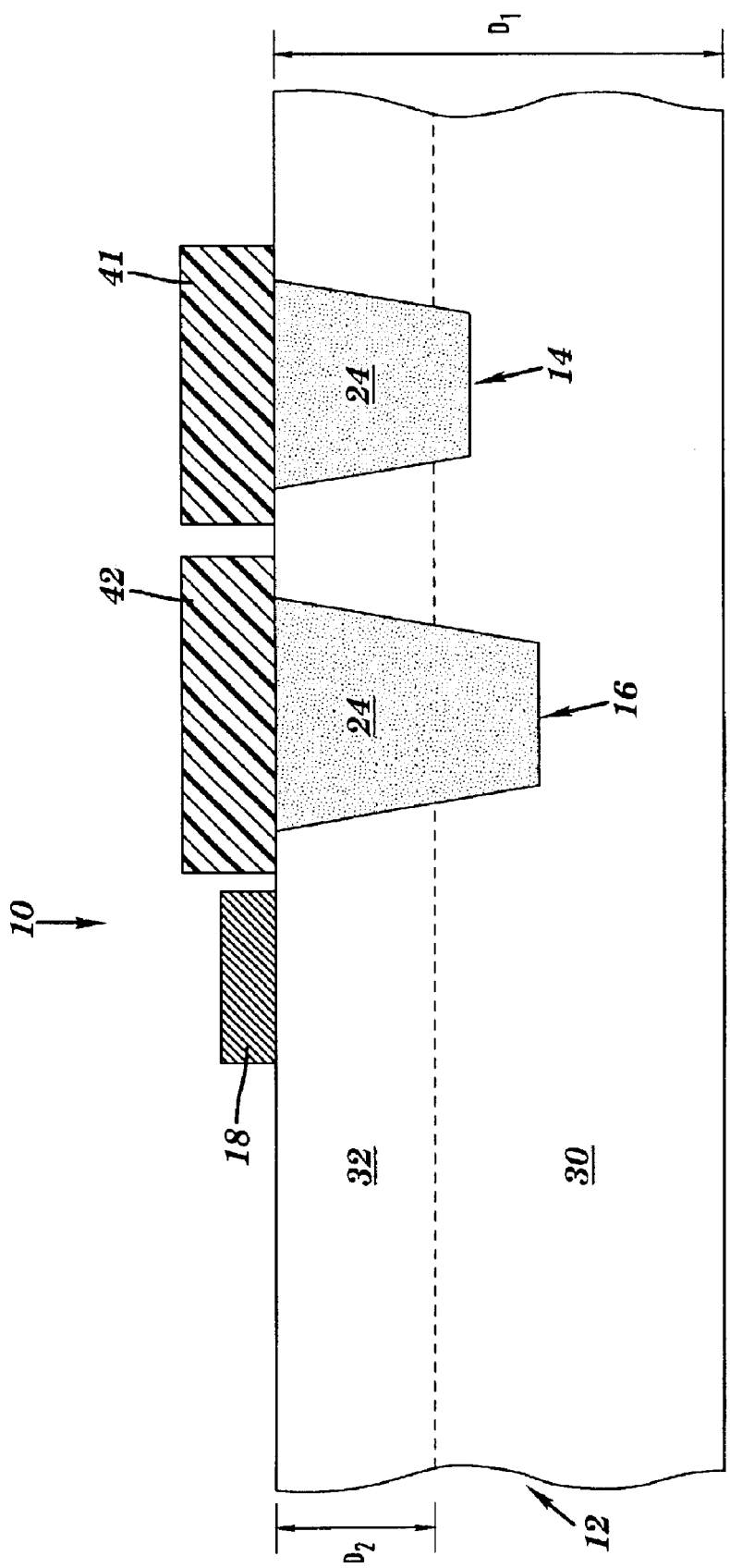
FIG. 8 depicts a variation of FIG. 3 in which the photoresist is disposed in the vias but is not disposed on the frontside of the substrate, in accordance with embodiments of the present invention, in accordance with embodiments of the present invention.

FIG. 8 depicts a variation of FIG. 3 in which the photoresist 24 is disposed in the vias 14 and 16 but not on the front surface 21 of the substrate 12, in accordance with embodiments of the present invention. In FIG. 8, the tapes 41 and 42 are adhesively placed on the photoresist 24 in the vias 14 and 16, respectively. Although not explicitly shown, the tapes 41 and 42 may each have a base portion and an adhesive portion analogous to the base portion 27 and adhesive portion 28, respectively, of the tape 26 of FIG. 3. Although shown as two separate tapes, the tapes 41 and 42 be structures as a single continuous tape analogous to the tape 26 of FIG. 3.

Figure 4:
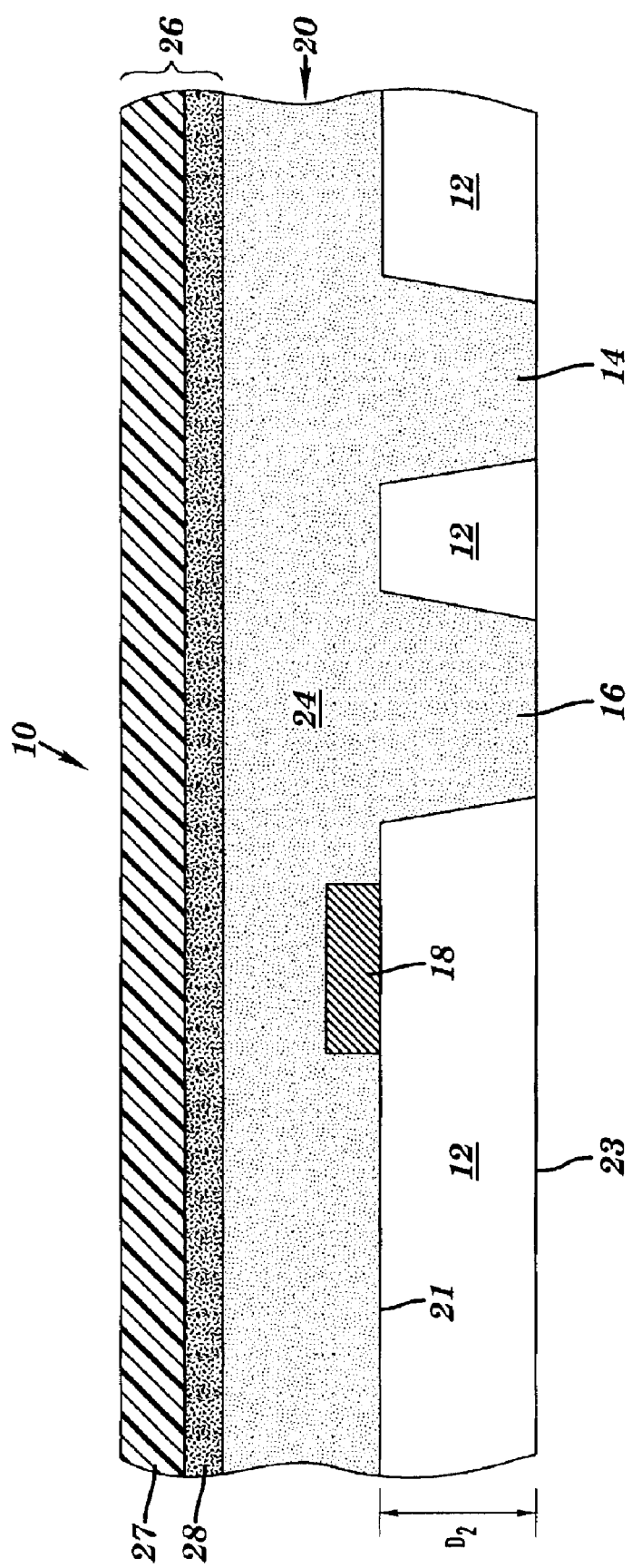
FIG. 4 depicts FIG. 3 following removal of the backside of the substrate, in accordance with embodiments of the present invention.

FIG. 4 depicts FIG. 3 following removal of the backside portion 30 of the substrate 12 to form a resulting surface 23 of the substrate 12 opposite the front surface 21 and located at about the depth $D_2$, in accordance with embodiments of the present invention. Thus in FIG. 4, the resulting substrate 12 has the thickness $D_2$ which is the depth of the frontside portion 32 (see FIG. 3). The removal of the backside portion 30 may be accomplished by, inter alia, grinding away the backside portion 30 to form said resulting surface 23; and polishing the resulting surface 23.

Figure 5:
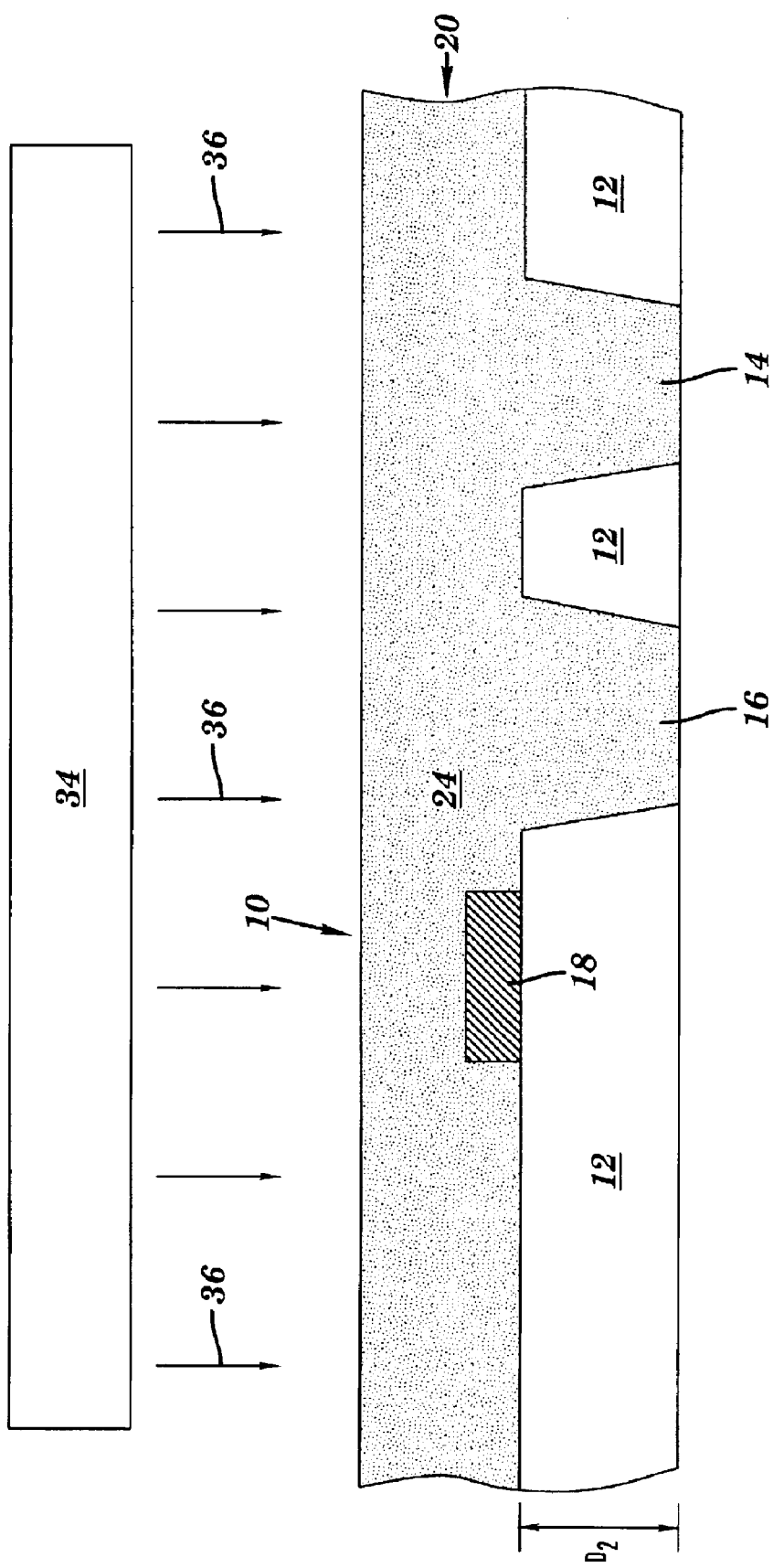
FIG. 5 depicts FIG. 4 after the tape has been removed, and a source of radiation has been added if the photoresist is a positive photoresist, in accordance with embodiments of the present invention.

FIG. 5 depicts FIG. 4 after the tape 26 has been removed, in accordance with embodiments of the present invention. If the photoresist 24 comprises a positive photoresist, then a source of radiation 34 is used to provide radiation 36. The radiation 36, which is characterized by a wavelength (e.g., an ultraviolet radiation wavelength) is directed into the photoresist 24 to make the photoresist 24 soluble in a developer solution. Alternatively, the photoresist 24 could be exposed to the radiation 36 prior to placement of the tape 26 on the photoresist 24 (see FIG. 3). If the photoresist 24 comprises a negative photoresist, then the photoresist 24 is soluble in the developer solution without being exposed to the radiation 36.

Figure 6:
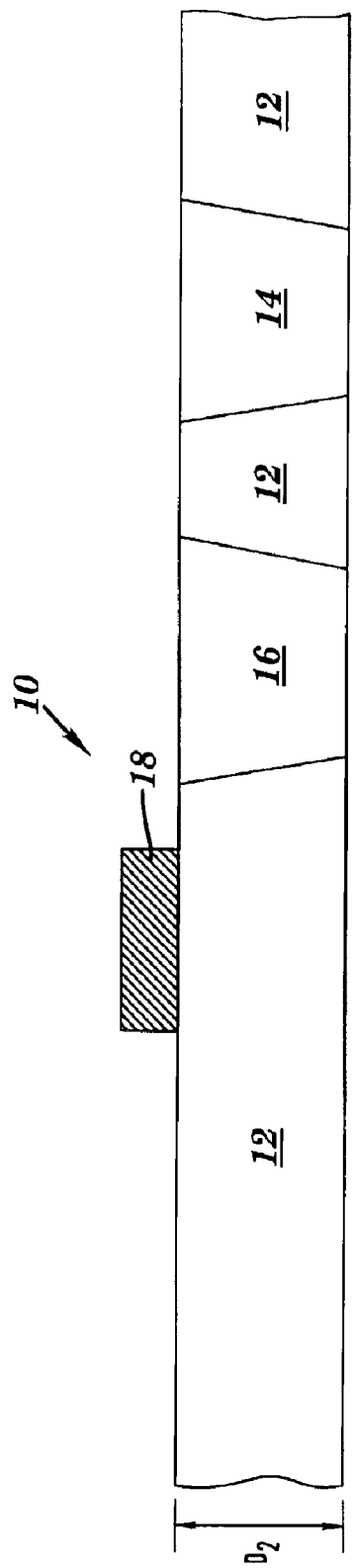
FIG. 6 depicts FIG. 5 after the photoresist has been removed, in accordance with embodiments of the present invention.

FIG. 6 depicts FIG. 5 after the photoresist 24 has been removed, in accordance with embodiments of the present invention. FIG. 6 also shows the metal circuitry 18 being uncovered by said removal of the photoresist 24. If the photoresist 24 is a positive photoresist and has been exposed to the radiation 36 or if the photoresist 24 is a negative photoresist and has not been exposed to the radiation 36, then the photoresist 24 may be removed by being developed away in a developer solution. If the photoresist 24 is a positive photoresist and has not been exposed to the radiation 36 or if the photoresist 24 is a negative photoresist and has been exposed to the radiation 36, then the photoresist 24 may be removed by being stripped away such as by use of a chemical solvent or by dry etching.

Figure 7:
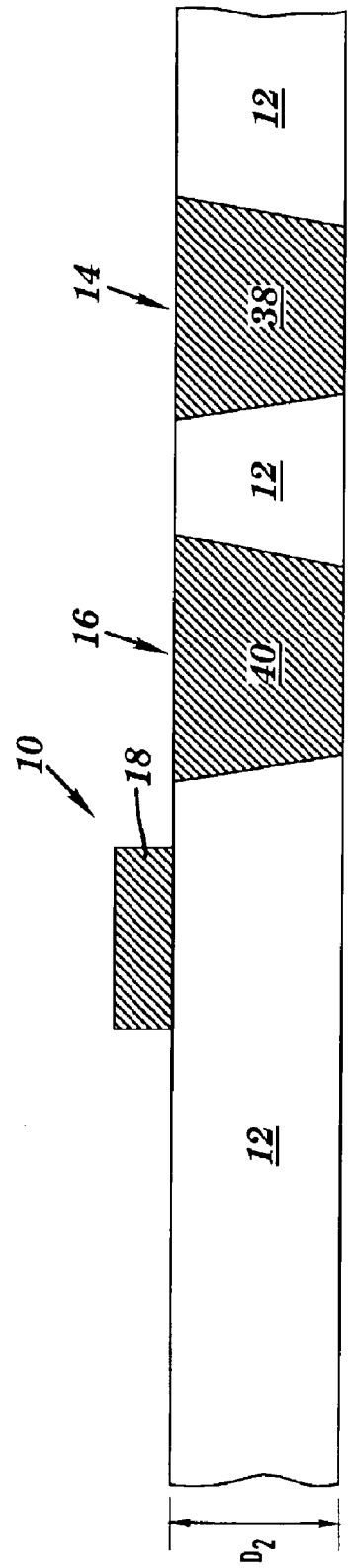
FIG. 7 depicts FIG. 6 after the vias have been filled with electrically conductive material to form electrically conductive through contacts in the vias, in accordance with embodiments of the present invention.

FIG. 7 depicts FIG. 6 after the vias 14 and 16 have been filled with electrically conductive material 38 and 40 to form electrically conductive through contacts in the vias 14 and 16, respectively, in accordance with embodiments of the present invention. The vias 14 and 16 may be filled with the electrically conductive material 38 and 40, respectively, by any method known to one of ordinary skill in the art such as by sputtering, evaporation, paste filling, etc. The electrically conductive material 38 and 40 may comprise copper or other metal or metallic alloy. The electrically conductive material 38 and 40 may comprise a same electrically conductive material or different electrically conductive materials.

Figure 9:
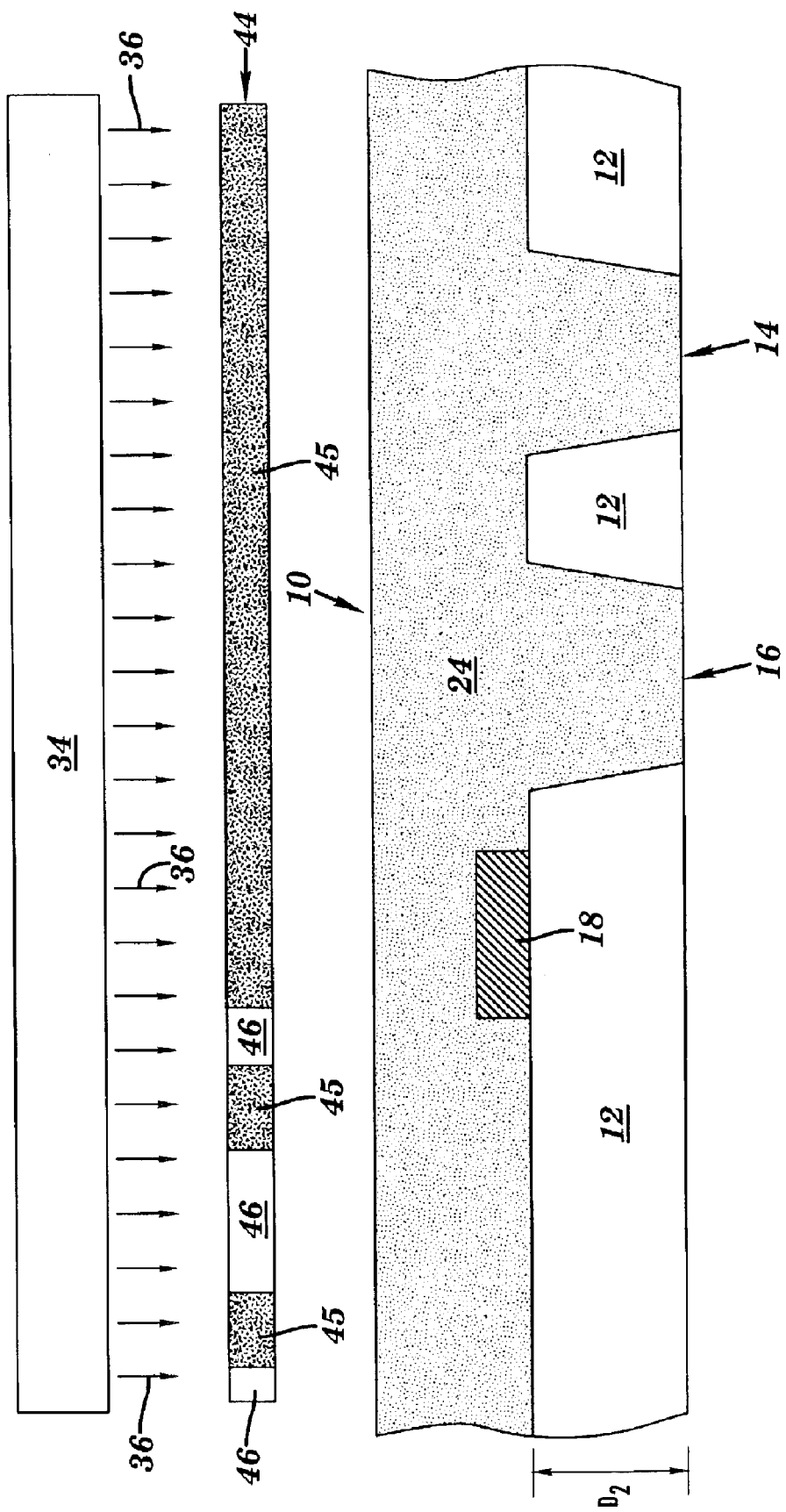
FIG. 9 depicts a variation of FIG. 5 with an added mask for selectively exposing the photoresist to the radiation, in accordance with embodiments of the present invention.

FIG. 9 depicts a variation of FIG. 5 with an added mask 44 for selectively exposing the photoresist 24 to the radiation 36, in accordance with embodiments of the present invention. The purpose of the mask 44 is to pattern the photoresist 24 for forming a circuit pattern in the substrate 12. The mask 44 comprises portions 45 and 46. If the photoresist 24 comprises a negative photoresist, then the portions 45 and 46 are respectively opaque and transparent to the radiation 36, so that the photoresist 24 directly below the portions 46 of the mask 44 (which are transparent) will interact with the radiation 36 and thus become insoluble in a developer solution, while the photoresist 24 directly below the portions 45 of the mask 44 (which are opaque) will not interact with the radiation 36 and thus remain soluble in the developer solution. If the photoresist 24 comprises a positive photoresist, then the opaque and transparent portions of the mask 44 are interchanged so that with a positive photoresist the portions 45 and 46 are respectively transparent and opaque to the radiation 36. Thus with the photoresist 24 comprising a positive photoresist, the photoresist 24 directly below the portions 45 of the mask 44 (which are transparent) will interact with the radiation 36 and thus become soluble in a developer solution, while the photoresist 24 directly below the portions 46 of the mask 44 (which are opaque) will not interact with the radiation 36 and thus remain insoluble in the developer solution. The preceding mask 44 configurations are such that the photoresist 24 in the vias 14 and 16 will be exposed to the radiation 36 if the photoresist 24 comprises a positive photoresist, and the photoresist 24 in the vias 14 and 16 will not be exposed to the radiation 36 if the photoresist 24 comprises a negative photoresist. Thus the photoresist 24 in the vias 14 and 16 will be soluble in the developer solution regardless of whether the photoresist 24 comprises a positive photoresist or a negative photoresist.

Figure 10:
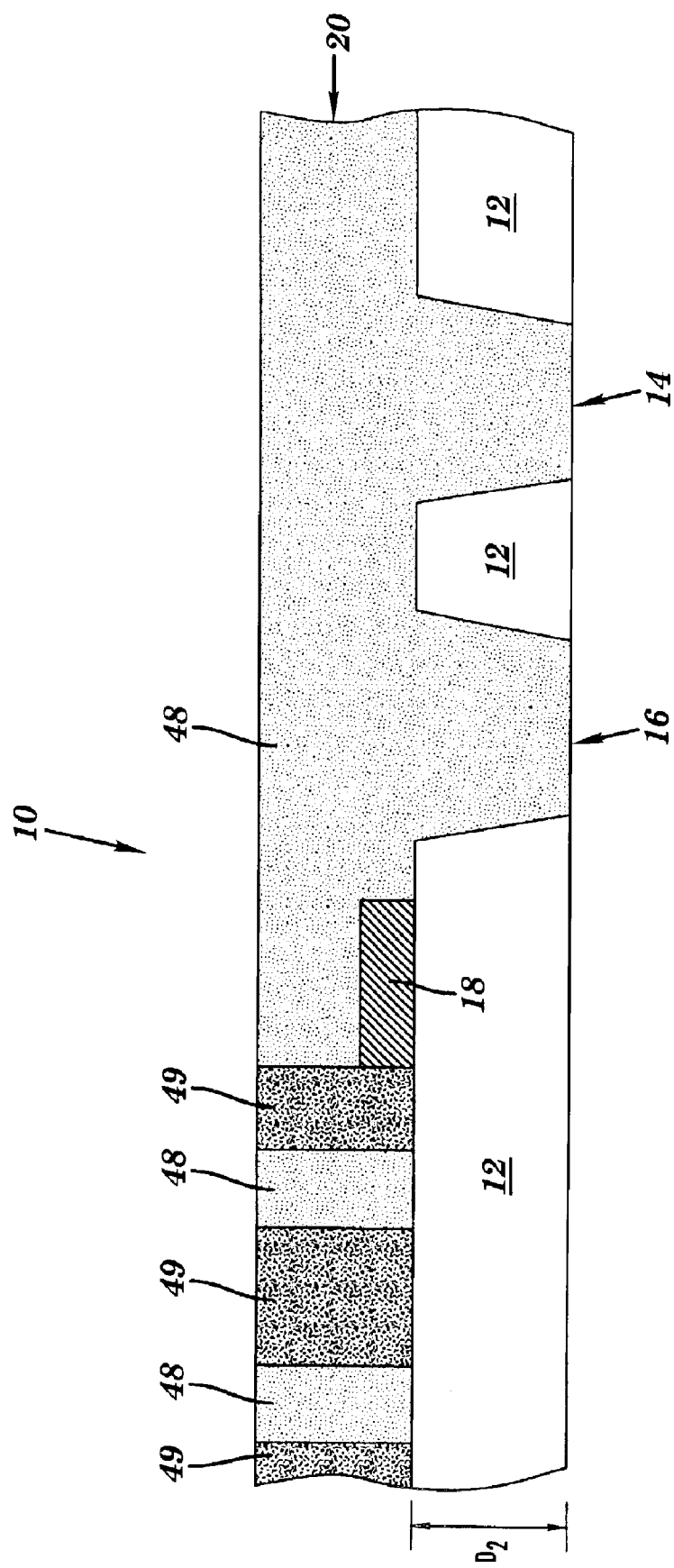
FIG. 10 depicts FIG. 9 after the photoresist has been selectively exposed to the radiation, in accordance with embodiments of the present invention.

FIG. 10 depicts FIG. 9 after the photoresist 24 has been selectively exposed to the radiation 36 in accordance with the mask 44, in accordance with embodiments of the present invention. The photoresist 24 is depicted in FIG. 10 as comprising portions 48 and 49. Due to the mask 44, the portions 48 are soluble in a developer solution and the portions 49 are not soluble in the developer solution, regardless of whether the photoresist 24 comprised a positive photoresist or a negative photoresist.

Figure 11:
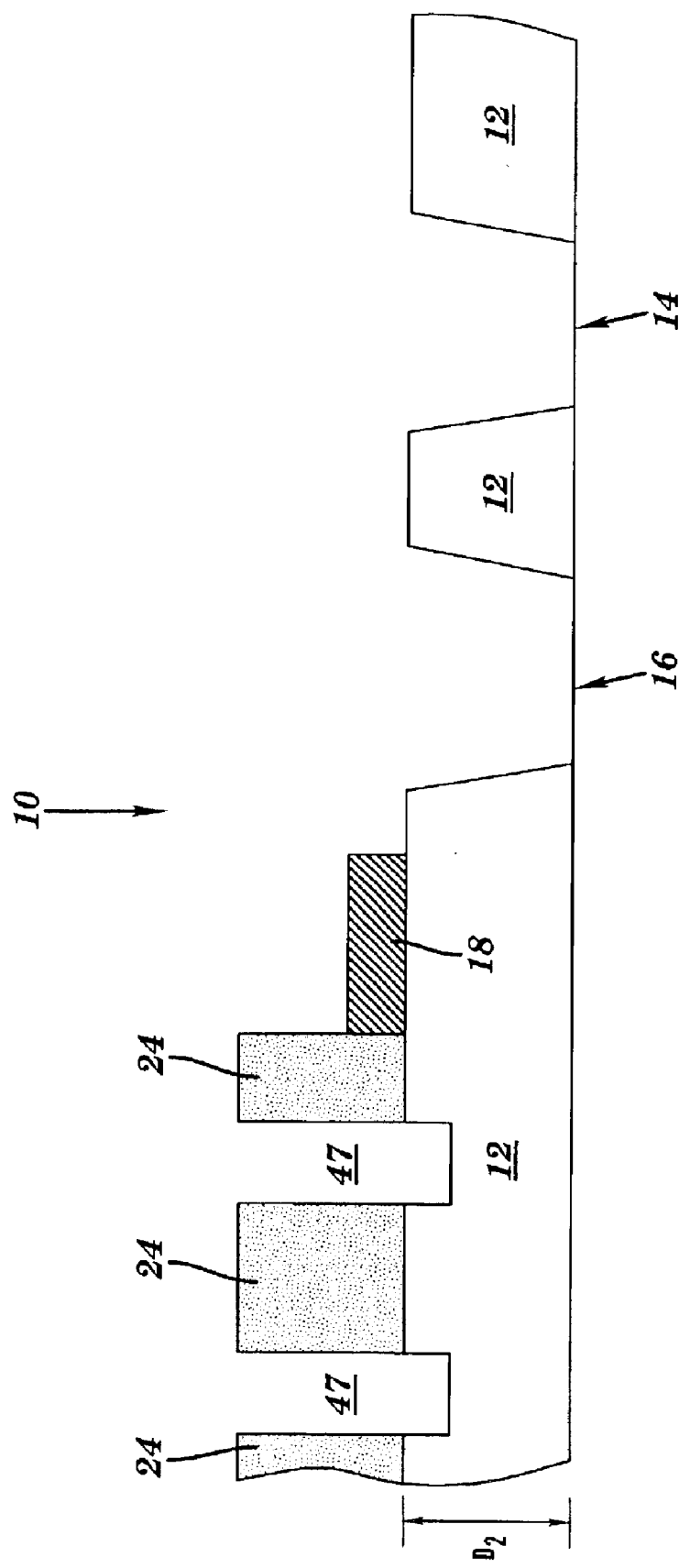
FIG. 11 depicts FIG. 10 after removal of portions of the photoresist and substrate material therebelow to form openings in the photoresist, in accordance with embodiments of the present invention.

FIG. 11 depicts FIG. 10 after removal of portions 48 of the photoresist 24 and substrate 12 material therebelow to form openings 47 in the photoresist 24, in accordance with embodiments of the present invention. FIG. 11 also shows that the photoresist 24 in and above the vias 14 and 16 has been removed. Said removal of said soluble portions 48 of the photoresist 24 may be accomplished by developing away said soluble portions 48 of the photoresist 24 in a developer solution. Removal of said portions of the substrate 12 at openings 47 may be accomplished by, inter alia, chemical etching.

Figure 12:
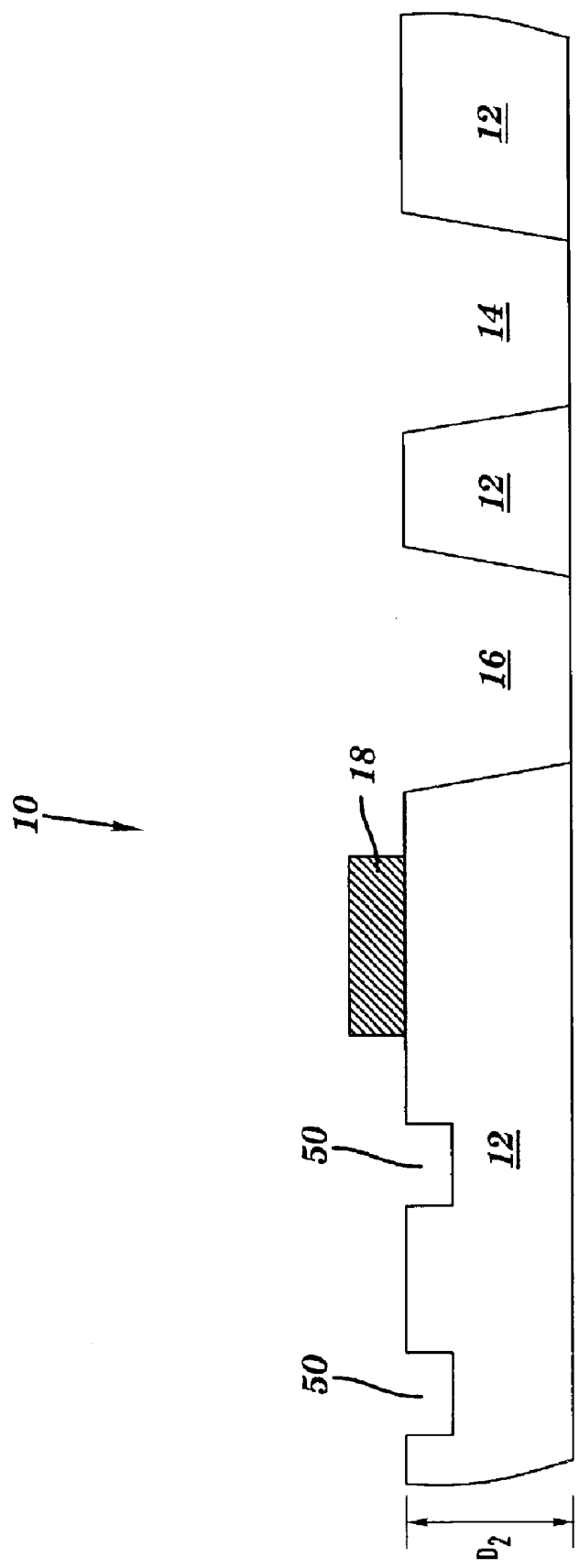
FIG. 12 depicts FIG. 11 after removal of the remaining photoresist to leave trenches in the substrate, in accordance with embodiments of the present invention.

FIG. 12 depicts FIG. 11 after removal of the remaining photoresist 24, such as by use of a solvent or dry etch, to leave trenches 50 in the substrate 12, in accordance with embodiments of the present invention. Removal of the photoresist 24 from the vias 14 and 16 may be accomplished before, concurrent with, or after removal of the remaining photoresist 24 from on the substrate 12.

Figure 13:
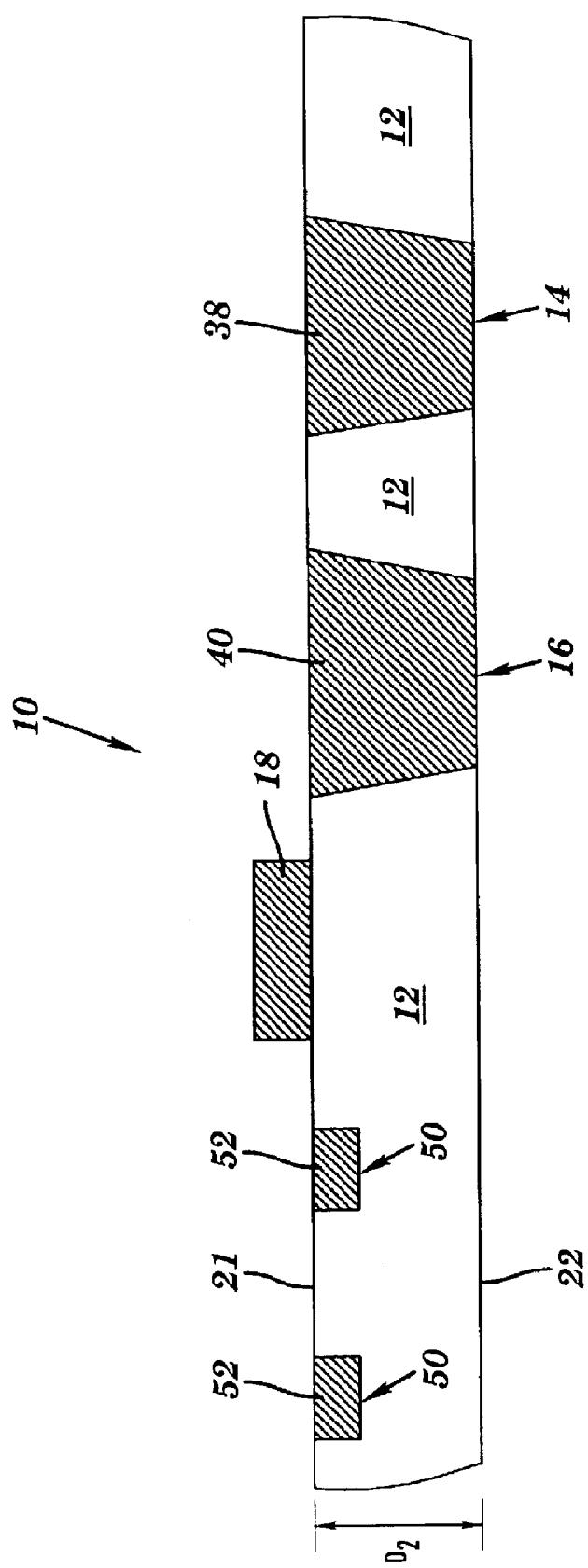
FIG. 13 depicts FIG. 12 after the trenches have been filled with a metallic material to form a metal circuit pattern, in accordance with embodiments of the present invention.

FIG. 13 depicts FIG. 12 after the trenches 50 have been filled with a metallic material (e.g., copper or other metal or metallic alloy) to form a metal circuit pattern 52, in accordance with embodiments of the present invention. Filling the trenches 50 with the metallic material may be accomplished by any method known to one of ordinary skill in the art such as by sputtering, evaporation, paste filling, etc. FIG. 13 also shows the vias 14 and 16 filled with the electrically conductive materials 38 and 40 to form electrically conductive through contacts in the vias 14 and 16, respectively. The electrically conductive material 38 and 40 may comprise copper or other metal or metallic alloy. The electrically conductive material 38 and 40 may comprise a same electrically conductive material or different electrically conductive materials.

Figure 14:
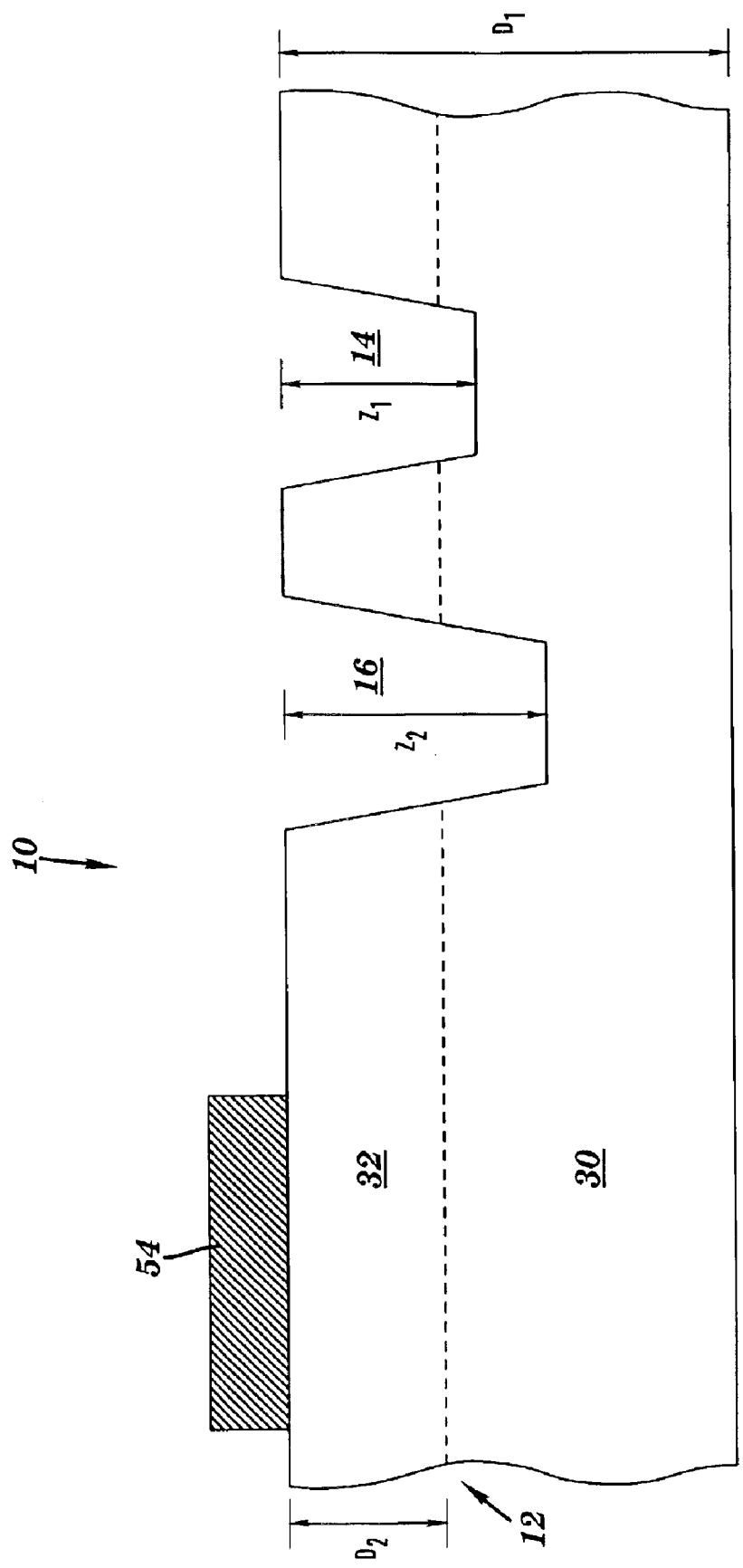
FIG. 14 depicts FIG. 1 with an added metal layer on the substrate, in accordance with embodiments of the present invention.

FIG. 14 depicts FIG. 1 with an added metal layer 54 on the substrate 12, in accordance with embodiments of the present invention. The metal layer 54 comprises any electrically conductive metal (e.g., copper) or metal alloy from which a metal circuit pattern may be formed. The metal circuitry 18 of FIG. 1 has been omitted in FIG. 14 for simplicity but may nevertheless be present.

Figure 15:
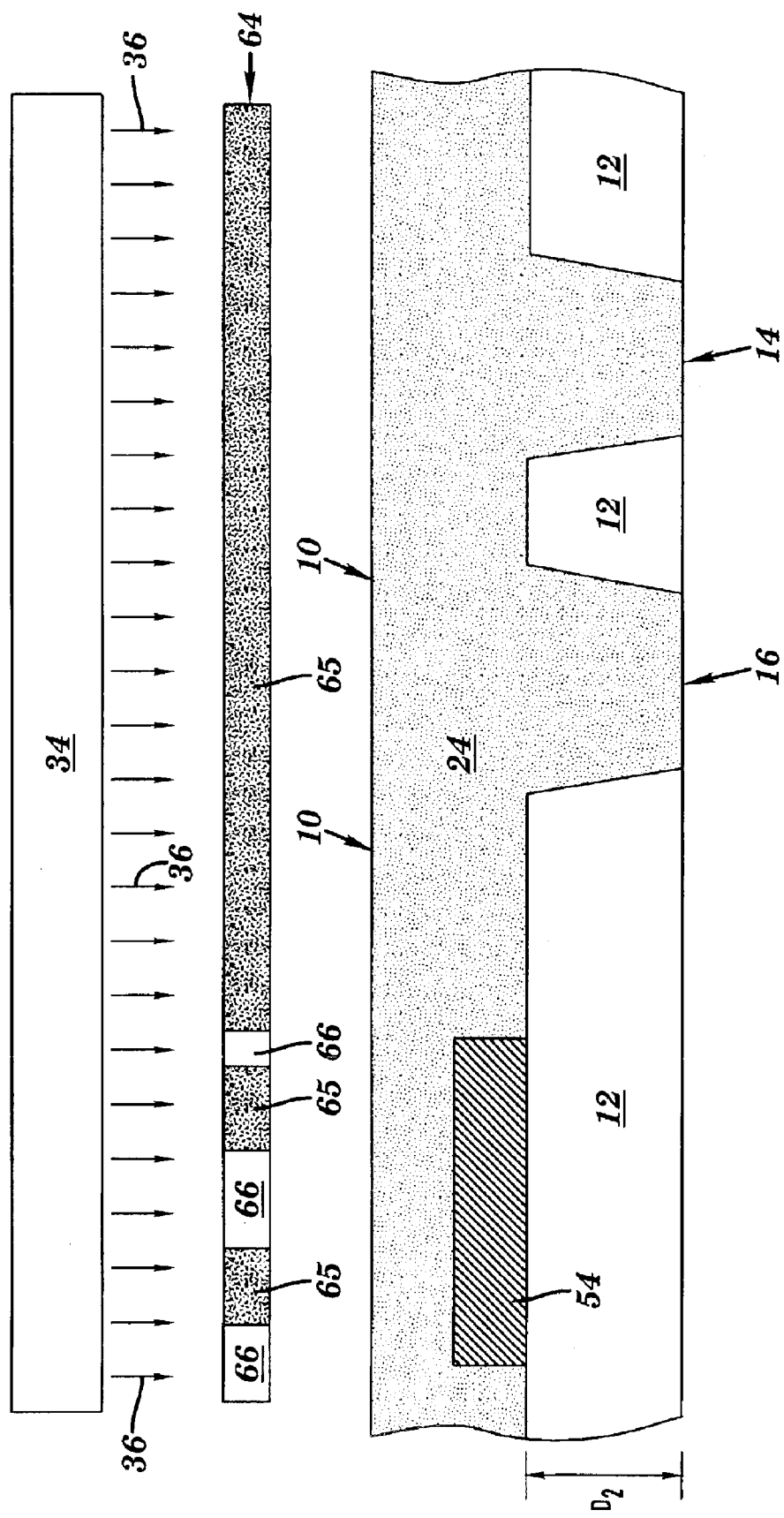
FIG. 15 depicts FIG. 14 with photoresist on the substrate and in the vias, and with an added radiation source and mask, in accordance with embodiments of the present invention.

FIG. 15 depicts FIG. 14 with the photoresist 24 on the substrate 12 and in the vias 14 and 16 after the backside 30 of the substrate 12 has been removed as described supra in conjunction with FIG. 4, in accordance with embodiments of the present invention. FIG. 15 also depicts the radiation source 34 and the associated radiation 36. The radiation 36 is selectively directed onto the photoresist 24 after passing through the mask 64. The mask 64 has portions 65 and 66, and the mask 64 selectively exposes the photoresist 24 to the radiation 36. The purpose of the mask 64 is to pattern the photoresist 24 for forming a circuit pattern on the substrate 12. If the photoresist 24 comprises a negative photoresist, then the portions 65 and 66 are respectively opaque and transparent to the radiation 36, so that the photoresist 24 directly below the portions 66 of the mask 64 (which are transparent) will interact with the radiation 36 and thus become insoluble in a developer solution, while the photoresist 24 directly below the portions 65 of the mask 64 (which are opaque) will not interact with the radiation 36 and thus remain soluble in the developer solution. If the photoresist 24 comprises a positive photoresist, then the opaque and transparent portions of the mask 64 are interchanged so that with a positive photoresist the portions 65 and 66 are respectively transparent and opaque to the radiation 36. Thus with the photoresist 24 comprising a positive photoresist, the photoresist 24 directly below the portions 65 of the mask 64 (which are transparent) will interact with the radiation 36 and thus become soluble in a developer solution, while the photoresist 24 directly below the portions 66 of the mask 64 (which are opaque) will not interact with the radiation 36 and thus remain insoluble in the developer solution. The preceding mask 64 configurations are such that the photoresist 24 in the vias 14 and 16 will be exposed to the radiation 36 if the photoresist 24 comprises a positive photoresist, and the photoresist 24 in the vias 14 and 16 will not be exposed to the radiation 36 if the photoresist 24 comprises a negative photoresist. Thus the photoresist 24 in the vias 14 and 16 will be soluble in a developer solution regardless of whether the photoresist 24 comprises a positive photoresist or a negative photoresist. After the photoresist 24 is selectively exposed to the radiation 36, the photoresist 24 will comprise first portions that are soluble in a developer solution (analogous to portions 48 of FIG. 10) and second portions that are not soluble in the developer solution (analogous to portions 49 of FIG. 10), regardless of whether the photoresist 24 comprised a positive photoresist or a negative photoresist.

Figure 16:
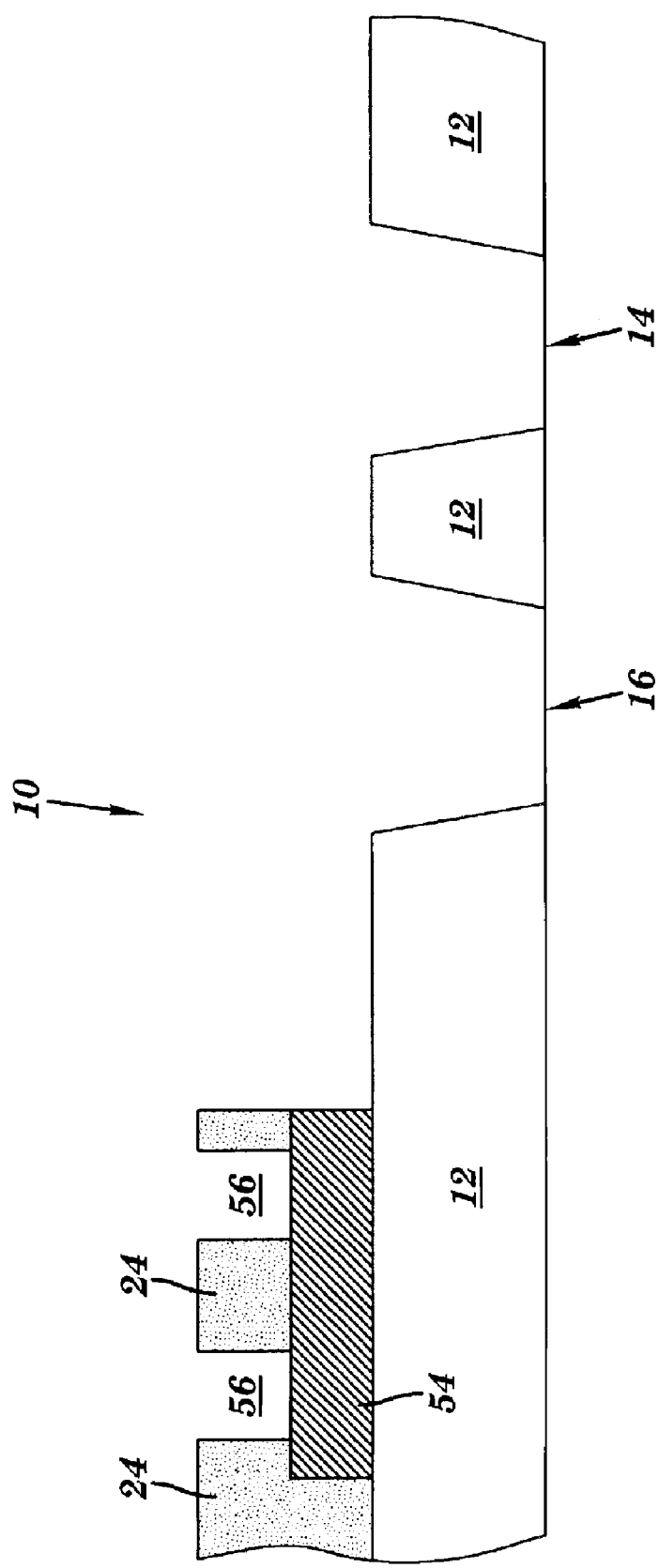
FIG. 16 depicts FIG. 15 after removal of a portion of the photoresist and substrate material therebelow to form openings in the photoresist in accordance with the mask, and in accordance with embodiments of the present invention.

FIG. 16 depicts FIG. 15 after the photoresist 24 has been selectively exposed to the radiation 36 in accordance with the mask 64 and after removal of said soluble first portions of the photoresist 24 to form openings 56 in the photoresist 24, in accordance with embodiments of the present invention. FIG. 16 also shows that the photoresist 24 in and above the vias 14 and 16 has been removed. Said removal of said soluble first portions of the photoresist 24 may be accomplished by developing away said soluble first portions of the photoresist 24 in a developer solution.

Figure 17:
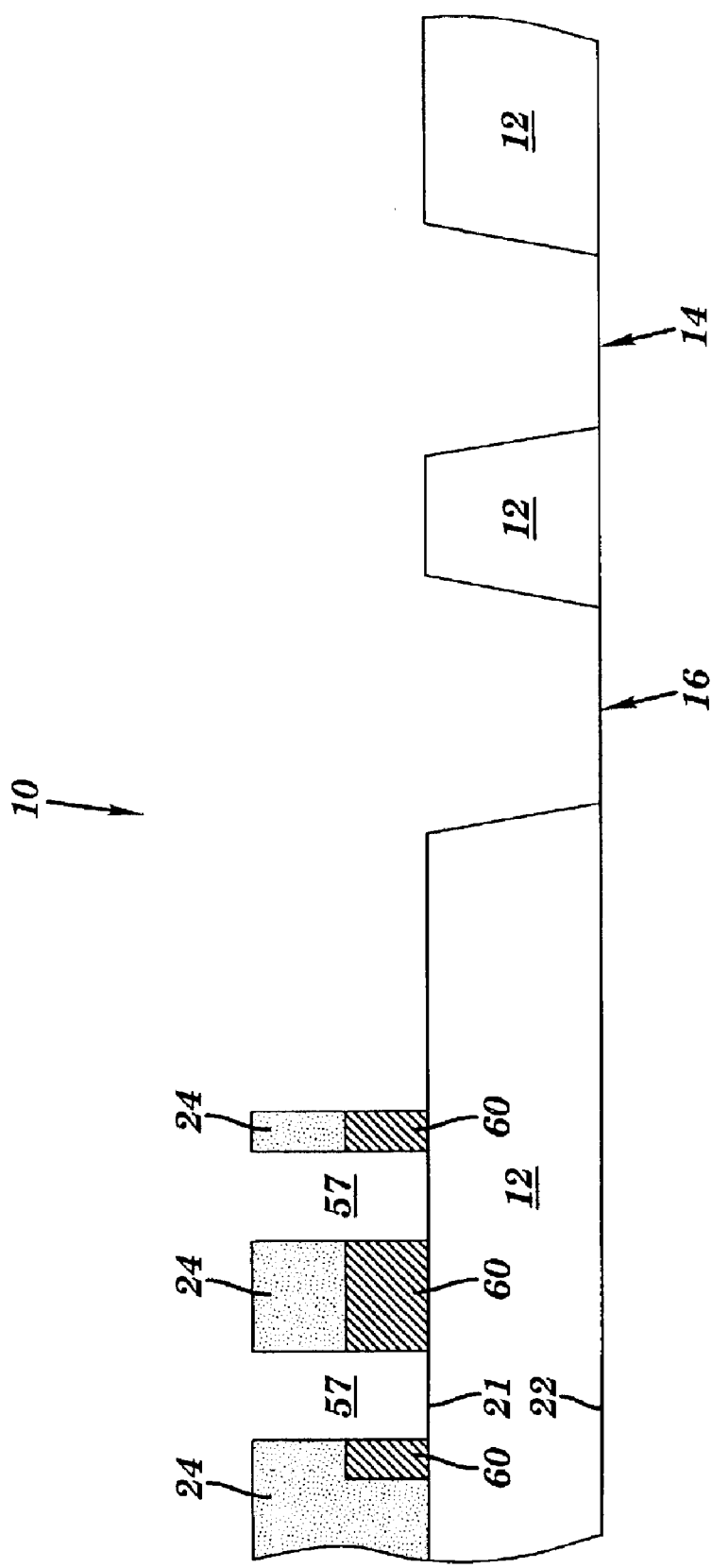
FIG. 17 depicts FIG. 16 after removal of the metal below the openings in the photoresist to form openings in the metal layer thereby forming a remaining metal circuit pattern, in accordance with embodiments of the present invention.

FIG. 17 depicts FIG. 16 after removal of the metal below the openings 56 to form openings in the metal layer 54, in accordance with embodiments of the present invention. The openings in the photoresist 24 and metal layer 54 combined are represented in FIG. 17 as the openings 57. The openings 57 isolate remaining portions of the metal layer 54 so as to form a metal circuit pattern 60. The removal of metal from the metal layer 54 may be accomplished by any method known to one of ordinary skill in the art such as by, inter alia, chemical etching. In FIG. 17, the metal circuit pattern 60 is covered by the remaining photoresist 24.

Figure 18:
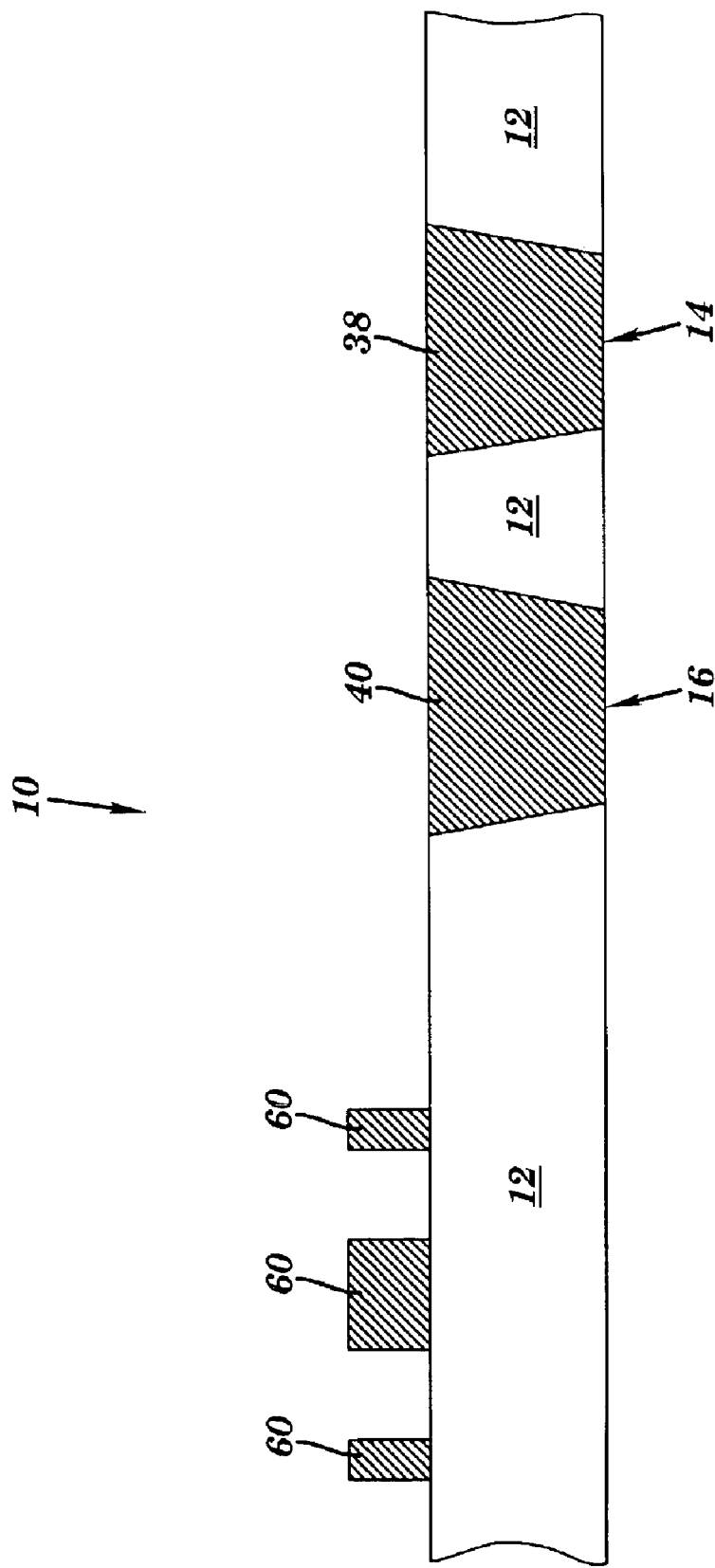
FIG. 18 depicts FIG. 17 after removal of the remaining photoresist to leave the metal circuit pattern uncovered, in accordance with embodiments of the present invention.

FIG. 18 depicts FIG. 17 after removal of the remaining photoresist 24 to leave the metal circuit pattern 60 uncovered, in accordance with embodiments of the present invention. FIG. 18 also shows the vias 14 and 16 filled with the electrically conductive materials 38 and 40 to form electrically conductive through contacts in the vias 14 and 16, respectively. The electrically conductive material 38 and 40 may comprise copper or other metal or metallic alloy. The electrically conductive material 38 and 40 may comprise a same electrically conductive material or different electrically conductive materials.

Figure 19:
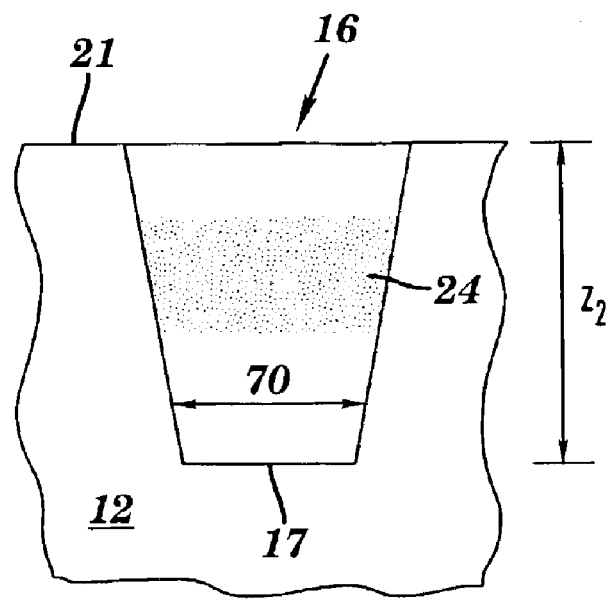
FIGS. 19–20 depicts alternative photoresist distributions in the vias of FIG. 2, in accordance with embodiments of the present invention.
Figure 20:
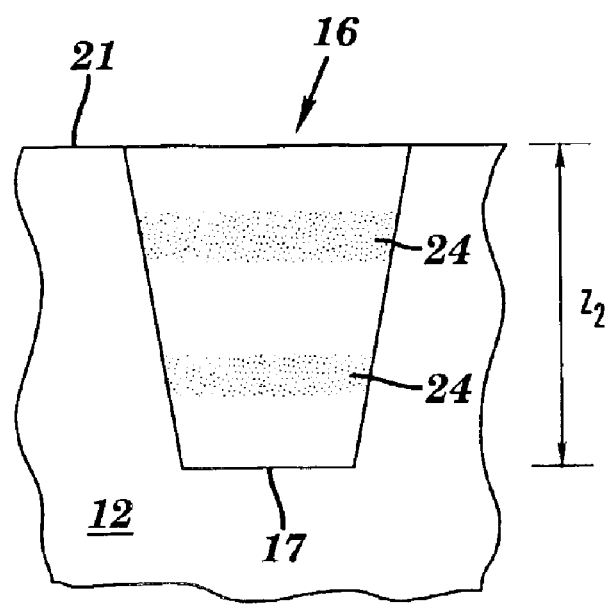

FIGS. 19–20 depicts alternative photoresist distributions in the via 16 of FIG. 2, in accordance with embodiments of the present invention. In FIG. 19, the photoresist 24 extends into the substrate 12 from below the surface 21 and does not extend to the bottom surface 17 of the via 16. In FIG. 20, the photoresist 24 is discontinuously distributed within the via 16. In FIGS. 19–20, the photoresist 24 is disposed between a first end of the via 16 (coinciding with the front surface 21 of the substrate 12) and a second end of the via 16 (coinciding with the bottom surface 17 of the via 16). Generally, any spatial distribution of the photoresist 24 that totally occupies any cross section of the via 16 (e.g., as represented by the cross section 70 of the via 16) is within the scope of the present invention even if the photoresist 24 does not totally fill the volume of the via 16. By totally occupying the cross section 70 of the via 16, the photoresist 24 decouples air pressure adjacent to the first end of the via 16 from air pressure adjacent to the second end of the via 16. Such decoupling of air pressure prevents a sudden flow of debris from the backside portion 30 of the substrate 12 to the frontside portion 32 of the substrate 12, thereby preventing damage to the frontside portion 32, when the backside portion 30 is being removed such as by grinding and polishing as described supra in conjunction with FIG. 4 (see FIG. 2 for depiction of the frontside portion 32 and the backside portion 30 of the substrate 12).

While embodiments of the present invention have been described herein in terms of using a photoresist, including inserting the photoresist into at least one via in a substrate and further including for some embodiments dispensing the photoresist on the front surface of the substrate as well as other uses of the photoresist as described herein, the scope of the present invention is not limited to the use of photoresist for those embodiment not requiring exposure of the photoresist to radiation. Accordingly, an organic material may be used as a general substitute for photoresist for all embodiments described herein such that the photoresist is not required to be exposed to radiation. The organic material may include photoresist or may not include photoresist. A method of inserting the organic material to into a via and applying the organic material to the front surface of the substrate, as well as a method of removing the organic material therefrom, includes any method(s) known to a person of ordinary skill in the art and may depend on the specific organic material that is used.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:
    a substrate having a front surface and a back surface on opposite sides of the substrate, wherein a first depth of the substrate extends from the front surface to the back surface;
    at least one via in the substrate, wherein each via of the at least one via extends from the front surface to a via depth into the substrate from the front surface, wherein the via depth is specific to each via, wherein the via depth of each via is less than the first depth, wherein each via comprises an organic material disposed between a first end of the via and a second end of the via, wherein the organic material in each via decouples air pressure adjacent to the first end of the via from air pressure adjacent to the second end of the via; and
    a tape covering the organic material in each via.

2. An electrical structure, comprising:
    a substrate having a front surface and a back surface on opposite sides of the substrate, wherein a first depth of the substrate extends from the front surface to the back surface;
    at least one via in the substrate, wherein each via of the at least one via extends from the front surface to a via depth into the sustrate from the front surface, wherein the via depth is specific to each via, wherein the via depth of each via is less than the first depth, wherein each via comprises an organic material disposed between a first end of the via and a second end of the via, wherein the organic material in each via decouples air pressure adjacent to the first end of the via from air pressure adjacent to the second end of the via; and a tape covering the organic material in each via, wherein the tape has a base portion and an adhesive portion, wherein the adhesive portion adhesively couples the tape to the organic material, and wherein the adhesive portion has a greater adhesion with the base portion than with the organic material.

3. The electrical structure of claim 1, wherein the organic material totally fills a first via of the at least one via.

4. The electrical structure of claim 1, wherein the organic material partially fills, but does not totally fill, a first via of the at least one via.

5. The electrical structure of claim 1, wherein the at least one via comprises a first via and a second via, and wherein the via depth of the first via is about equal to the via depth of the second via.

6. The electrical structure of claim 1, wherein the at least one via comprises a first via and a second via, and wherein the via depth of the first via is unequal to the via depth of the second via.

7. The electrical structure of claim 1, wherein the organic material comprises a photoresist.

8. The electrical structure of claim 1, wherein the organic material comprises a positive photoresist.

9. The electrical structure of claim 1, wherein the organic material comprises a negative photoresist.

10. The electrical structure of claim 1, wherein none of said organic material is disposed on the front surface.

11. An electrical structure, comprising:
a substrate having a front surface and a back surface on opposite sides of the substrate, wherein a first depth of the substrate extends from the front surface to the back surface; and
at least one via in the substrate, wherein each via of the at least one via extends from the front surface to a via depth into the substrate from the front surface, wherein the via depth is specific to each via, wherein the via depth of each via is less than the first depth, wherein a first organic material on the front surface is soluble in a developer solution, wherein a second organic material on the front surface is not soluble in the developer solution, and wherein each via comprises a third organic material disposed between a first end of the via and a second end of the via.

12. The electrical structure of claim 11, wherein the third organic material is soluble in the developer solution.

13. The electrical structure of claim 11, wherein the third organic material is not soluble in the developer solution.

14. The electrical structure of claim 11, wherein the third organic material comprises a photoresist.

15. The electrical structure of claim 11, further comprising a tape covering the third organic material in each via.

16. The electrical structure of claim 15, wherein the tape has a base portion and an adhesive portion, wherein the adhesive portion adhesively couples the tape to the third organic material, and wherein the adhesive portion has a greater adhesion with the base portion than with the organic material.

17. The electrical structure of claim 15, wherein the third organic material comprises a photoresist.

18. The electrical structure of claim 11, further comprising metal circuitry attached to the front surface, wherein the first organic material covers metal circuitry.

19. The electrical structure of claim 11, wherein the electrical structure further comprises a metal layer on the front surface of substrate, wherein the first organic material covers a first portion of the metal layer, and wherein the second organic material covers a second portion of the metal layer.

20. An electrical structure, comprising:
a substrate having a front surface and a back surface on opposite sides of the substrate, wherein a first depth of the substrate extends from the front surface to the back surface; and
at least one via in the substrate, wherein each via of the at least one via extends from the front surface to a via depth into the substrate from the front surface, wherein the via depth is specific to each via, wherein the via depth of each via is less than the first depth, wherein a first organic material on the front surface and in direct mechanical contact with the front surface is soluble in a developer solution, wherein a second organic material on the front surface and in direct mechanical contact with the front surface is not soluble in the developer solution, wherein each via comprises a third organic material disposed between a first end of the via and a second end of the via, and wherein the first end of the via is about coplanar with the front surface of the substrate.

21. The electrical structure of claim 20, wherein the third organic material is soluble in the developer solution.

22. The electrical structure of claim 20, wherein the third organic material is not soluble in the developer solution.

23. The electrical structure of claim 20, wherein the third organic material comprises a photoresist.

24. The electrical structure of claim 20, further comprising a tape covering the third organic material in each via.

25. The electrical structure of claim 24, wherein the tape has a base portion and an adhesive portion, wherein the adhesive portion adhesively couples the tape to the third organic material, and wherein the adhesive portion has a greater adhesion with the base portion than with the organic material.

26. The electrical structure of claim 24, wherein the third organic material comprises a photoresist.

27. The electrical structure of claim 20, further comprising metal circuitry attached to the front surface, wherein the first organic material covers metal circuitry.

28. The electrical structure of claim 20, wherein the electrical structure further comprises a metal layer on the front surface of substrate, wherein the first organic material covers a first portion of the metal layer, and wherein the second organic material covers a second portion of the metal layer.

29. The electrical structure of claim 2, wherein the at least one via comprises a first via and a second via, and wherein the via depth of the first via is about equal to the via depth of the second via.

30. The electrical structure of claim 2, wherein the at least one via comprises a first via and a second via, and wherein the via depth of the first via is unequal to the via depth of the second via.

31. The electrical structure of claim 2, wherein the organic material comprises a photoresist.

32. The electrical structure of claim 2, wherein none of said organic material is disposed on the front surface.

* * * * *